(12) United States Patent
Hoffmeyer et al.

(10) Patent No.: US 10,756,009 B1
(45) Date of Patent: Aug. 25, 2020

(54) EFFICIENT PLACEMENT OF GRID ARRAY COMPONENTS

(71) Applicant: International Business Machines Corporation, Armonk, NY (US)

(72) Inventors: Mark K. Hoffmeyer, Rochester, MN (US); Brian Beaman, Cary, NC (US); Yuet-Ying Yu, Hopewell Junction, NY (US); Theron Lee Lewis, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/574,523

(22) Filed: Sep. 18, 2019

(51) Int. Cl.
  *H01L 23/498* (2006.01)
  *H01L 21/48* (2006.01)
  *H01R 12/58* (2011.01)

(52) U.S. Cl.
  CPC ...... *H01L 23/49827* (2013.01); *H01L 21/486* (2013.01); *H01L 21/4853* (2013.01); *H01L 23/49816* (2013.01); *H01L 23/49866* (2013.01); *H01R 12/585* (2013.01)

(58) Field of Classification Search
  CPC ............. H01L 23/49827; H01L 21/486; H01L 21/4853; H01L 23/49816; H01L 23/49866; H01R 12/585
  USPC ...................................................... 174/257
  See application file for complete search history.

(56) References Cited

U.S. PATENT DOCUMENTS

| | | | |
|---|---|---|---|
| 4,822,288 A * | 4/1989 | Conley | H01R 12/58 439/221 |
| 5,425,649 A * | 6/1995 | Reymond | H01L 24/72 257/E23.078 |
| 5,944,563 A * | 8/1999 | Nagafuji | H01R 12/585 439/751 |
| 6,828,512 B2 * | 12/2004 | Chung | H05K 3/3436 174/260 |
| 7,094,065 B2 | 8/2006 | Canella | |
| 7,264,486 B2 | 9/2007 | Ma | |
| 7,871,274 B2 * | 1/2011 | Chiang | H05K 1/141 439/66 |
| 8,969,734 B2 | 3/2015 | Murphy et al. | |
| 10,128,593 B1 | 11/2018 | Hejase et al. | |
| 10,135,162 B1 | 11/2018 | Hejase et al. | |
| 2008/0032524 A1 * | 2/2008 | Lemke | H01R 12/57 439/78 |
| 2012/0270432 A1 * | 10/2012 | Jaeckle | C23C 18/1653 439/397 |
| 2013/0316551 A1 * | 11/2013 | Day, Jr. | H05K 13/04 439/84 |
| 2016/0276763 A1 | 9/2016 | Rathburn | |

OTHER PUBLICATIONS

Hejase et al., "A Hybrid Land Grid Array Socket Connector Design for Achieving Higher Signalling Data Rates," 2017 IEEE 26th Conference on Electrical Performance of Electronic Packaging and Systems (EPEPS), 2017, 3 pages.

\* cited by examiner

*Primary Examiner* — Sherman Ng
(74) *Attorney, Agent, or Firm* — Peter J. Edwards

(57) ABSTRACT

An interposer comprises a metal-plated via that spans the depth of a printed circuit board. The interposer also comprises a metal plug inserted into a first end of the metal-plated via. The metal plug is attached to the metal-plated via. The metal plug may take the form of a solid plug or a sintered via plug. The interposer also comprises a solder ball soldered to the metal plug.

10 Claims, 4 Drawing Sheets

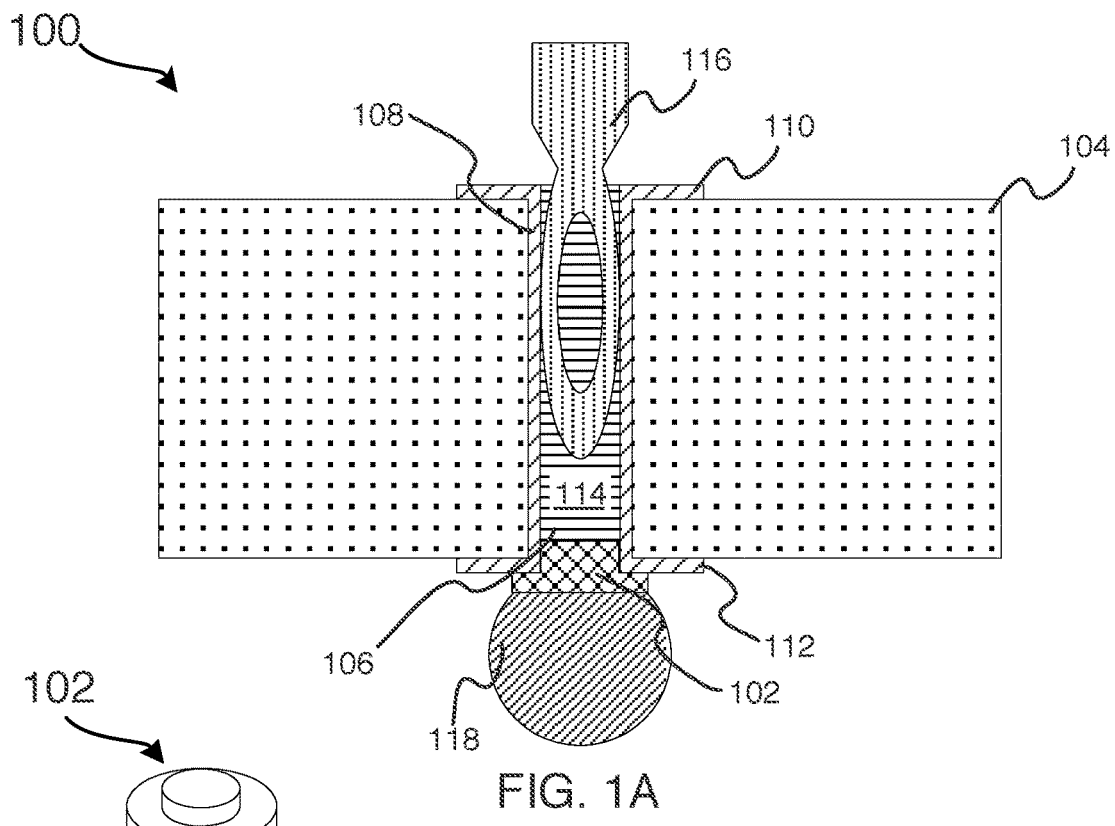
FIG. 1A
FIG. 1B
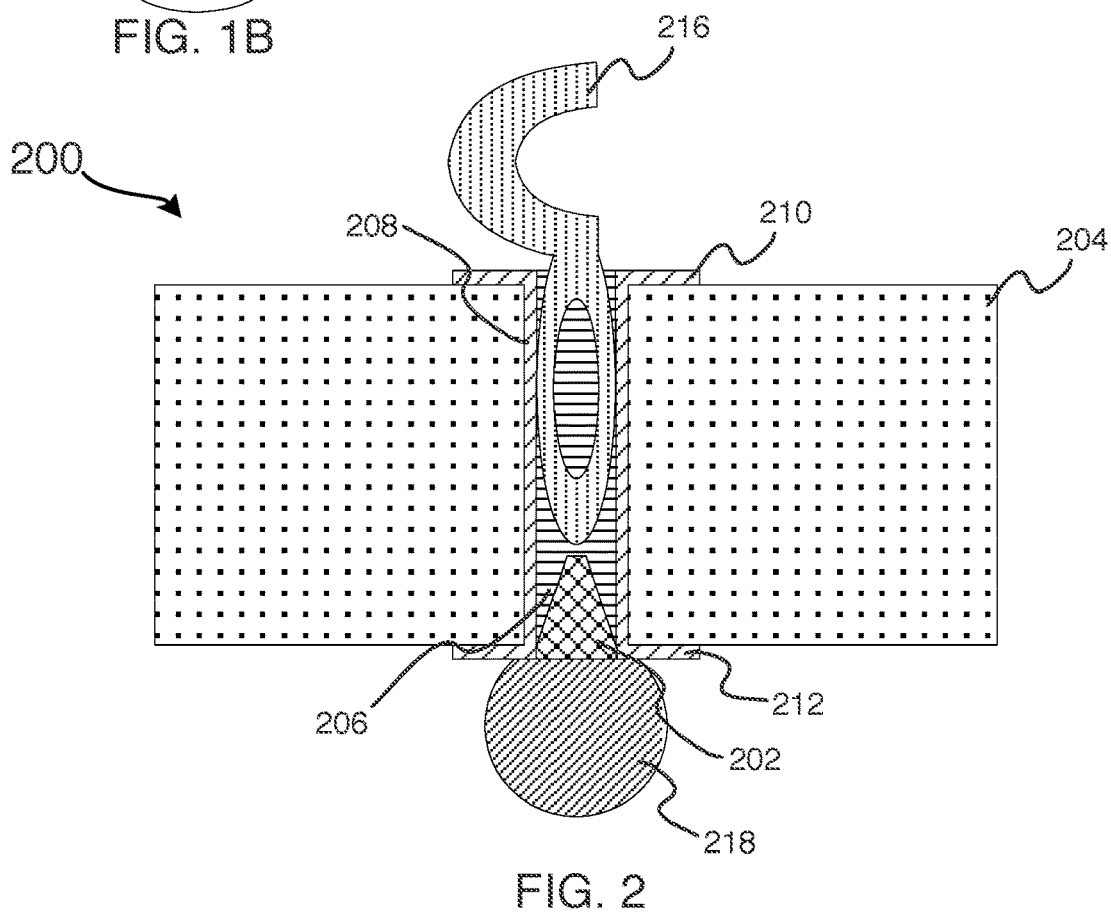
FIG. 2

EFFICIENT PLACEMENT OF GRID ARRAY COMPONENTS

BACKGROUND

The present disclosure relates to surface-mount arrays, and more specifically, to placement of components on high-performance surface-mounts arrays.

Surface-mount grid arrays, such as ball-grid arrays (BGAs) and hybrid land-grid arrays (HLGAs), are often used to connect the components of a first substrate board (e.g., a central-processor-unit package) to another substrate board (e.g., a motherboard). BGAs and HLGAs typically utilize solder balls to structurally and electrically connect a substrate board to a larger substrate board. BGAs are often found on CPU packages that are intended to be permanently affixed to a motherboard. HLGAs are often found on interposers that interface with land-grid-array components (e.g., a CPU package) on one side and a larger substrate board (e.g., a motherboard) on a second side. HLGAs typically utilize solder balls to secure and electrically connect the interposer to the larger substrate board. HLGAs also typically include pins or springs to electrically connect the interposer to the land-grid-array component. HGLAs often include a metal-plated via that electrically connects the solder balls to the pins.

SUMMARY

Some embodiments of the present disclosure can also be illustrated as a method comprising applying a sintering paste to the metal plating of a via on a interposer. The method may also comprise heating the sintering paste to a temperature at which the sintering paste solidifies, resulting in a sintered via plug. The method may also comprise applying a solder ball to the sintered via plug. Finally, the method may comprise heating the solder ball to a temperature at which the solder ball bonds to the sintered via plug.

Some embodiments of the present disclosure can also be illustrated as a interposer comprising a metal-plated via spanning the depth of a printed circuit board. The interposer may also comprise a metal plug inserted into a first end of the metal-plated via. The metal plug may be attached to the metal-plated via. Finally, the interposer may comprise a solder ball soldered to the metal plug.

Some embodiments of the present disclosure can also be illustrated as a interposer comprising a metal-plated vial. The interposer may also comprise a press-fit pin that comprises a first section that enters a first end of the metal-plated via, a second section that is inside the metal-plated via, and a third section that exits the metal-plated via, wherein the third section terminates in a tapered point. The interposer may also comprise a solder ball inserted onto the third section and plugging the metal-plated via. The solder ball may contact the second end of the metal plated via.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 1A depicts a cross-section illustration of a hybrid-land-grid-array interposer with a solid nail-head via plug, in accordance with embodiments of the present disclosure.

FIG. 1B depicts a perspective view of one embodiment of a via plug, in accordance with embodiments of the present disclosure.

FIG. 2 depicts a cross-section illustration of a hybrid-land-grid-array interposer with a solid conical via plug, in accordance with embodiments of the present disclosure.

Figure 3:
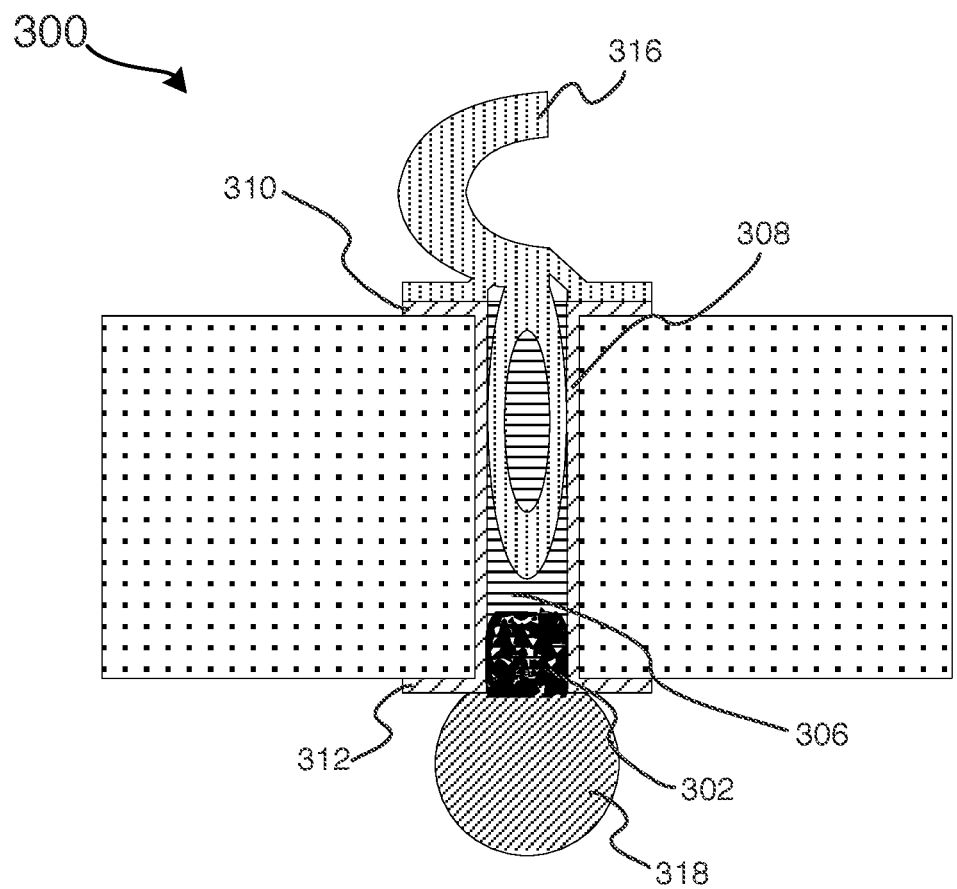
FIG. 3 depicts a cross-section illustration of a hybrid-land-grid-array interposer with a sintered via plug, in accordance with embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to surface-mount arrays, more particular aspects relate to hybrid land grid arrays. While the present disclosure is not necessarily limited to such applications, various aspects of the disclosure may be appreciated through a discussion of various examples using this context.

As computing components, such as central processing units (CPUs) storage devices graphical processing units (GPUs), and other peripheral devices increase in speed and capability, the connections between those computing components sometimes become limitations on the performance of those devices. For example, if a CPU is connected to another CPU for tandem processing, and each CPU is capable of processing 60 gigabits of data per second in a typical workload, but the connections between those CPUs can only transmit a maximum of 30 Gigabits per second (Gbps), the performance of the CPUs could be cut in half by the speed of the connection.

One method to increase the data speed of an electronic signal is to increase the frequency of that signal. As the frequency of a signal increases, the number of cycles of that signal that occur in a given period of time (e.g., in one second) increase. In typical encoding schemes, each cycle of a signal encodes a pre-determined number of bits (e.g., 1 bit per cycle). Thus, increasing the frequency of a data transmission can the increase data speed of the transmission. For this reason, transmitting signals between high-productivity computer components (e.g., between a CPU and a GPU) at high frequency is a possible method of increasing the rate at which the electrical connection between those computer components can deliver data, and thus a possible method of reducing the likelihood that those electrical connections will limit the performance of those computer components.

However, transmitting signals of a higher frequency can have consequences in some use cases. For example, signals that operate at high frequency tend to travel on the periphery of the medium through which they are travelling, and the periphery of most signal-carrying media (e.g., wires, contacts, solder balls, pins, springs) is also where the media tends to undergo the most changes in geometry. A change in media geometry may refer to, for example, a change in the shape of the signal-carrying medium (e.g., a wire taking a turn), a change in the material itself (e.g., a socket pin transitioning from silver to copper), or a change in the properties of other media that are adjacent to the media through which the signal is propagating (e.g., a copper wire that is partially enclosed by a silica substrate and partially exposed to air). Thus, high-frequency signals may be more sensitive to changes in the media geometry of conductors than low-frequency signals.

Unfortunately, when a signal propagates through a change in geometry, it can undergo a signal reflection. When a signal reflection occurs, part of the signal's propagation energy (i.e., the energy that is causing the signal to move forward through the medium) can be reflected. In other words, some of the signal's propagation energy continues to move forward toward the signal destination, but part of the signal's propagation energy (the reflected energy) moves in another direction. After a sufficient number of reflections, a signal may arrive at a destination with such low propagation that it cannot be accurately deciphered.

Because signals that travel at a high frequencies tend to travel along the periphery of transmission media, and because geometry changes tend to occur more frequently at the periphery of transmission media, signals that travel at high frequency may be particularly susceptible to signal degradation (a term for, among other things, the signal's propagation energy reducing during travel). Therefore, while high-frequency signals may be theoretically capable of delivering more bits per second, practical applications of high-frequency signals may not benefit from those theoretical higher data rates without also reducing geometry changes in the path of the signal in the transmission media. In other words, the data-rate benefits of using high-frequency signals may be improved when the signal is able to follow a more direct (e.g., straight) path from the data source to the data destination.

The above discussed issues have become relevant in hybrid land grid arrays (HLGAs). As discussed previously, HLGAs typically take the form of interposers between a land-grid-array (LGA) component (e.g., a CPU) and a larger board (e.g., a motherboard). Most HLGAs contain a layer of solder balls on one end that connects to the larger board, an LGA connection (e.g., pins or springs) on another end that connects to the LGA component, and a metal-plated via that connects the solder balls and LGA connection. Typically, each solder ball in the layer of solder balls connects to a contact pad near the via that connects a circular pad of metal (referred to herein as an "annular ring") that surrounds the via's diameter on the substrate surface and connects to the via's metal plating. The connection between the contact pad and the annular ring may be direct (i.e., the contact pad directly contacts the annular ring) or through an intermediary element (e.g., a wire).

Unfortunately, this method of connecting solder balls to HLGA vias can create a circuitous route for a signal to travel between entering the solder ball and entering the via. A signal typically is required to follow a sharp turn after passing from the solder ball to the contact pad, and may turn again between the contact pad and the annular ring (for example, if the contact pad is connected to the annular ring with a wire). Further, use cases may involve several other types of geometry changes along the signal path, such as a change in material composition or diameter between the contact pad and the annular ring. For these reasons, transmitting high-frequency signals through typical HGLAs sometimes results in significant signal reflections, causing significant signal degradation.

One potential method of addressing these issues may be to attach HLGA solder balls directly over the via openings, preventing circuitous routing to the via and reducing other geometry changes. However, while this may enable a more direct signal path from the solder ball to the via, it can also create manufacturability issues. During HLGA assembly, solder balls are typically attached in a solder-paste form before they are heated through the soldering process. Solder paste composition can vary based on the use case, but it is typically a non-solid mixture of metal powder (referred to herein as "solder") and a material called flux. Flux composition can also vary based on use case, but it typically includes a temporary adhesive and a cleaning agent. The temporary adhesive serves to cause the solder to adhere both to itself, and to the components to which the solder is intended to bond (e.g., a contact pad), until the soldering process creates a more permanent connection. The cleaning agent serves to remove corrosion and impurities from the components to which the solder is intended to bond to make them "solderable." Once a component it solderable, it is possible for liquid solder to cling to the component during the soldering process, after which the solder may harden on the component.

Because solder paste, and the flux therein, is not solid, the flux can sometimes flow to areas beyond which it is applied. For example, if a solder ball were set on a contact pad with an attached wire, the flux in the solder ball may, due to the acceleration of gravity, flow from the contact pad and spill onto the wire. The flux may then clean the wire, which, depending on the metal composition of the wire (e.g., nickel, silver, copper) would cause it to become solderable. Once the solder is melted during the solder process, it may also flow from the contact pad to the wire. In addition to creating a potentially unintended soldered bond with the wire, this would also reduce the size of the solder ball that is able to bond to the contact pad.

For this reason, attaching solder balls directly onto via openings in an HLGA use case may create complications. Because solder balls, and the flux therein, are not solid, the flux may, in some instances, be capable climb the interior plated walls of the via through capillary action. Then, when the solder is heated through the solder process, the metal powder in the solder would melt and become subject to the forces of capillary action. The solder may then climb the via walls in the same way that the flux did. Further, because the metal walls were previously treated by the flux, the liquid solder may then be able to cling to the walls and harden.

Depending on the amount of solder that is able to cling to the via walls, this could lead to negative consequences. For example, the solder ball may lose significant volume to the via and be incapable of making a solid connection to another board (e.g., a motherboard) as a result. In this case, the HLGA may not be fit for its intended use.

In some embodiments, it may be possible to fill the via with another substance, such as a resin, which would then allow a contact pad to be placed over the hole. However, this method may be difficult to control in use cases involving HLGA designs because some of the via may be needed for a press-fit connection of the pin. Thus, in HLGA use cases, the via would either need to be filled only partially or some resin may need to be removed after the fact. For example, a drill could be used to remove enough of the resin from the via for a compliant pin to be inserted. However, both these options would likely be difficult to control, and may require manual human intervention. This could drive down yields and drive up cost, and thus is not an ideal solution.

Embodiments of the present disclosure address these problems by plugging a via hole, either completely or partially, before applying a solder ball directly under the hole. In some embodiments, this may prevent flux from entering the via prior to soldering, which would leave the via uncleaned and less solderable. Thus, when the solder balls are soldered, the solder is unlikely to climb the via, allowing more solder to be used in the solder-ball connection.

In some embodiments of the present disclosure, a metal plug is used to completely block a via before a solder ball is attached to the metal plug. The metal plug may then be cleaned with the flux in the solder ball such that the solder in the solder ball is able to cling to the plug during the solder process. In this way, the solder ball may provide a direct route to an HLGA via, preventing signal-strength integrity during high-frequency communication.

In some embodiments of the present disclosure, a compliant pin with a long, pointed end may be inserted into a via such that the pointed end sticks out the solder-ball end of the via. These pointed ends may help to partially plug the via opening, making it less likely that solder-paste flux could climb the via and clean the metal plating therein, making it solderable. These pointed ends may also serve as an attachment point for the solder balls, which could allow them to be placed directly over the open via hole without shifting prior to soldering.

FIG. 1A depicts a cross-section illustration of a hybrid-land-grid-array interposer 100 with a solid nail-head via plug 102, in accordance with embodiments of the present disclosure. Interposer 100 includes a substrate 104, which may take the form of a printed circuit board (PCB). Substrate 104 contains, as illustrated, via 106, which has been drilled through substrate 104. Via 106, as illustrated, has been plated with a metal compound (e.g., copper, silver, tin). This plating is illustrated in several places of FIG. 1A: plating cross-section 108 depicts a cross-section of the plating over the via walls, annular rings 110 and 112 depict cross sections of the annular rings that surround the perimeter of via 106 on the top and bottom surface of substrate 104, respectively, and plating surface 114 depicts the surface of the plating within via 106. Compliant pin 116 rests in via 106, and may have been inserted into via 106 in a press-fit process. As illustrated, the top of compliant pin 116 takes the form of a straight pin, but may also take other forms (e.g., a spring) consistent with the embodiments of this disclosure. Finally, solder ball 118 has been inserted onto via plug 102.

As illustrated, interposer 100 may have gone through a soldering process. For example, interposer 100 may depict an HLGA after solder ball 118 has been reflowed onto via plug 102 and onto another component (e.g., a motherboard) that is opposite interposer 100 with respect to solder ball 118. In such an example, solder ball 118 would be a solid component of metal (e.g., tin). Interposer 100 may also be, as illustrated in a condition before solder ball 118 has been soldered to 102 and before interposer 100 has been soldered to another component. In such an example, solder ball 118 may be a non-solid mixture of solder paste.

This solder paste may contain flux, which might, in some typical HLGA designs, be capable of wicking up a via (for example, through capillary forces) and cleaning a plating surface therein. If this occurred, that plating surface would be solderable, meaning that nearby solder could also climb up the via (also through capillary forces) and cling to the plating surface.

However, interposer 100 contains via plug 102, which is designed to prevent both flux and solder from wicking up via 106. For this reason, solder that may otherwise be lost from solder ball 118 during a soldering process (e.g., reflow to via plug 102) would be retained within solder ball 118 until solder ball 118 solidified during the reflow process. This may, in some use cases, increase the likelihood that solder ball 118 would form a successful bond (structural and mechanical) to interposer 100 and to another component (e.g., a motherboard).

Via plug 102 may have been attached to interposer 100 in a press-fit process, similar to the press-fit process that may have attached compliant pin 116 to interposer 100. For example, the narrow section of via plug 102 may be a specific diameter that causes significant friction between the sides of via plug 102 and plating surface 114. This friction may create sufficient heat to microscopically melt the metals of via plug 102 and plating surface 114, resulting in a bonded press-fit connection between metal plug 102 and plating surface 114. In other embodiments, via plug 102 may have been attached to interposer 102 though a soldered connection. In some such embodiments, a temporary connection between via plug 102 and interposer 100 may keep via plug 102 in place in via 106 before the soldering process. For example, via plug 102 may originally be attached using a temporary adhesive, such as a small amount of flux placed between via plug 102 and annular ring 112. Via plug 102 may also originally be connected with a temporary press-fit connection (e.g., press-fit connection that is not "tight" enough to form bonding, but is "tight" enough to keep via plug 102 in place temporarily).

In some embodiments, via plug 102 may be soldered to interposer 100 through the same process that solder ball 118 is soldered to interposer 100. For example, if flux is applied to the sides of the broad portion of via plug 102 (i.e., the larger circle in FIG. 1B) and annular ring 112, some solder from solder ball 112 may wick onto each surface during the solder process. This may result in via plug 102 being secured by solder ball 118, annular ring 112, and via 106.

In the illustrated embodiment, via plug 102 takes a nail-head form. This form is shown with more detail in FIG. 1B, a perspective view of via plug 102. In some embodiments, the broad section of via plug 102 may provide a broad surface for solder ball 118 to attach to. In embodiments in which via plug 102 is also a conductive metal (e.g., copper or a copper-based alloy), this may allow via plug 102 to act as a contact pad that could carry an electrical signal from solder ball 118 to the metal plating in via 106 (e.g., though annular ring 112 or directly to plating surface 114).

As illustrated, via plug 102 takes the form of a solid plug, rather than, for example, a sintered plug. Via plug 102 may have been casted out of molten metal (e.g., copper), or machined out of solid metal. In some embodiments, via plug 102 may also itself have been electroplated with metal. This may be beneficial, for example, to increase the solderability of via plug 102. For example, if via plug 102 were machined out of solid nickel (a metal to which typical solder compounds do not wick), via plug 102 may be plated with copper to allow solder ball 118 to cling to via plug 102 before a solder process.

As discussed, via plug 102 is illustrated in a nail-head form. However, in some embodiments a via plug may take other forms and still function to prevent flux and solder from entering a via. Such an embodiment is disclosed in FIG. 2.

FIG. 2 depicts a cross-section illustration of a HLGA interposer 200 with a solid conical via plug 202. As illustrated, via plug 202 is completely inserted into via 206 such that the bottom face of via plug 202 is flush with the bottom face of annular ring 212. In this embodiment, solder ball 218 may be soldered both to via plug 202 and annular ring 212, which may increase the structural connection between solder ball 218 and interposer 200. This may further result in fewer geometry/material changes along a signal pathway between solder ball 218 and compliant pin 216. As illustrated, the top of compliant pin 216 takes the form of a spring, the top of which may be designed to interface with a pad on an LGA package.

FIG. 2 may also be useful to visualize an example pathway a high-frequency signal may take through interposer 200. For example, a CPU package may connect to the spring on pin 216 and a motherboard may connect to solder ball 218. If, for example, a user sent a communication to the CPU and from a peripheral device (e.g., a discrete GPU device) attached to the motherboard, that signal may enter solder ball 218 from a contact pad on the motherboard. Because the signal is, in this example, a high-frequency signal, it may travel along the periphery of solder ball 218 and enter annular ring 212. The signal may then travel along the periphery of annular ring 212 and along the periphery of the metal plating in via 206. In the embodiment shown, the signal may then pass to compliant pin 216, at which point it may travel up the periphery of the pin shaft and the pin spring, exiting into a contact pad on the CPU package. In typical instances, some portion of the high-frequency signal would tend propagate over the entire surface area of all connected conductors of interposer 200. However, as illustrated, a portion of the signal would be required to pass from the metal plating of via 206 through the shaft portion of compliant pin 216 in order to eventually flow into the example connected CPU package. However, in other embodiments compliant pin 216 may contact annular ring 210, which may provide a more efficient path for a signal to travel. Such an embodiment is illustrated in FIG. 3.

FIGS. 1A, 1B, and 2 all disclose solid via plugs that may be formed, for example, by casting or machining before insertion into an interposer via. However, in some embodiments a via plug may take the form of a sintered metal. In some of these embodiments, the sintered plug may be formed prior to insertion in an interposer via. In other embodiments, the sintered plug may be formed after insertion in an interposer via.

FIG. 3 depicts a cross-section illustration of a HLGA interposer 300 with a sintered via plug 302. Via plug 302 may have been formed, for example, out of a transient liquid paste composed of flux, binders, and metal particles. When heated near to but below the melting point of those metal particles, the metal particles in the paste may heat up to a sufficient degree for a small amount (e.g., a microscopic layer) of each metal particle at the surface of each particle to partially melt. The partially melted liquid layers may then cling to other metal particles and other partially melted metal layers. Once the paste cools, the partially melted particles may become solid again, creating a solid bonded structure in what was previously a paste. As discussed above, this process may be referred to as "sintering."

In some embodiments, via plug 302 may be a sintered plug that was previously composed of a paste containing a tin-bismuth mixture and copper (or silver). In other examples, the sintered plug may be composed of a copper or silver nanoparticle paste. In examples that utilize tin-bismuth, the tin-bismuth mixture may have a low melting point (e.g., 150 degrees Celsius), and thus may experience microscopic melting at low temperatures. For this reason, a sintering paste mixed with tin-bismuth may undergo sintering at a lower temperature, allowing sintering to be performed nearby heat-sensitive components.

In some embodiments, via plug 302 may be formed and sintered before being inserted into via 306. In these embodiments, via plug 302 may be secured into via 306 though a press-fit process. In some embodiments, via plug 302 may be temporarily secured in via 306 until solder ball 318 is soldered to interposer 300. In other embodiments, via plug 302 may be added to via 306 as a paste (e.g., through use of a stencil or screen printing). In these embodiments, via plug 302 may be heated as a paste in via 306, causing via plug 302 to undergo sintering and bond with the plated walls of via 306 and solidify.

As illustrated, solder ball 318 is placed over via plug 302 and part of annular ring 312. If soldered in this position, solder ball 318 may bond to both via plug 302 and annular ring 312, provided that both via plug 302 and annular ring 312 are cleaned with flux and composed of solderable metals (e.g., copper).

Like FIG. 2, FIG. 3 may also be useful to visualize the path that a signal may take when flowing through interposer 300. As illustrated, however, interposer 300 differs from interposer 200 in that a signal travelling through interposer 200 would not be limited to moving through the shaft portion of compliant ring 316. This is compliant ring 316 includes contact pads that interface with annular ring 310. Thus, because some portion of the high-frequency signal would tend propagate over the entire surface area of the connected conductors a direct signal path through the periphery of metal plating in via 306 through annular ring 310 and into the spring portion of compliant pin 316 would be possible. This may enable a signal to traverse interposer 300 while undergoing fewer changes in geometry, and thus undergoing less attenuation. This may, in turn, increase the signal strength that is communicated through interposer 300.

FIGS. 1A through 3 illustrate example via plugs that are designed to completely fill the lower opening of the via of an interposer, providing a surface to which a solder ball may be attached. However, in some embodiments it may be possible to partially block an interposer via. In such embodiments, surface tension and solder masking may be utilized to prevent solder from entering the via.

Figure 4:
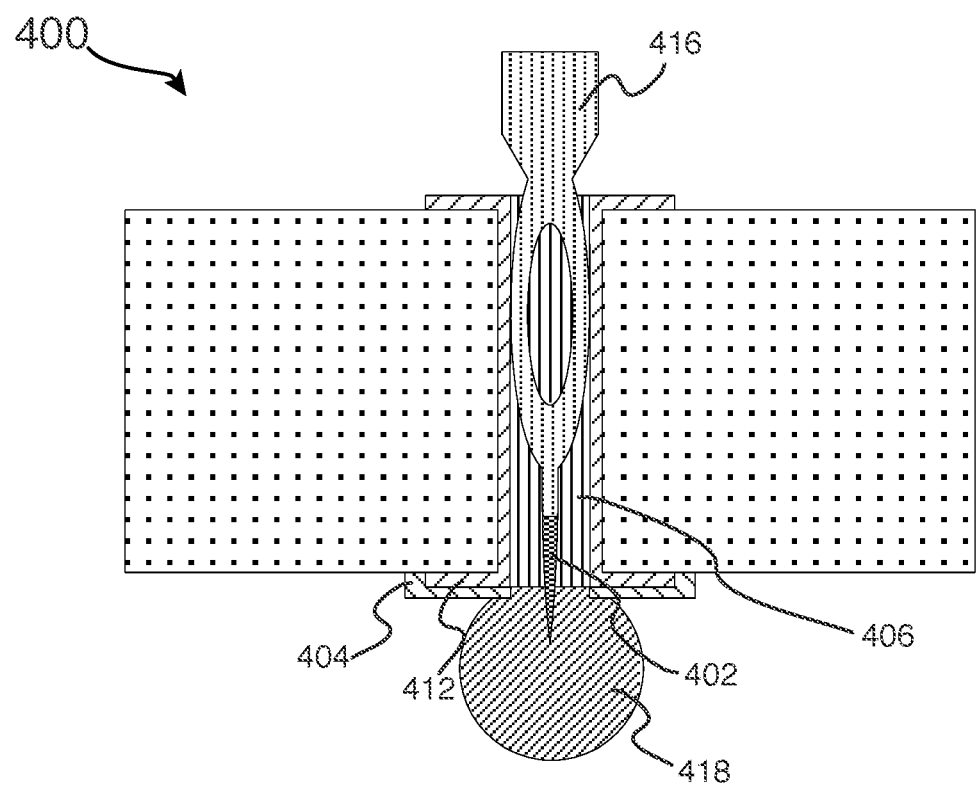
FIG. 4 depicts a cross-section illustration of a hybrid-land-grid-array interposer with a spear-head pin, in accordance with embodiments of the present disclosure.

FIG. 4 depicts a cross-section illustration of a hybrid-land-grid-array interposer 400 with a spear-head pin 416 that partially blocks the bottom opening of via 406 with spearhead 402. As illustrated, spearhead 402 fills only a portion of via 406. However, due to the adhesive and cohesive forces of flux and melted solder, the flux and solder within solder ball 418 may not wick up via 406 prior to and during soldering. Rather, the flux and solder may adhere to spearhead 402 and the metal plated walls of via 406 through adhesive forces and remain gathered together through cohesive forces. In this way, spearhead 402 may act to block solder from entering via 406 without obstructing the entire opening.

Spearhead 402 may also provide a surface to which solder ball 418 may be temporarily attached prior to a soldering process. This may be helpful in the illustrated embodiment because interposer 400 does not contain a solid plug to which solder ball 408 could stick to without entering via 406.

In some embodiments, the surface tension provided by the cohesive and adhesive forces between and among the metal plating of via 406, solder ball 418, and spearhead 402 may be sufficient to prevent any flux or solder from climbing via 406. However, in some embodiments, interposer 400 may also contain additional features that may help prevent flux and solder from entering via 406.

For example, while typical interposer vias are often plated with copper, via 406 may be plated with nickel, which is not solderable. This would make it unlikely for liquid solder to cling to the nickel walls of via 406 during soldering. Similarly, spearhead 402 may be plated with nickel to prevent any solder from climbing the spearhead and filling via 406. Alternatively, compliant pin 416 may be composed of nickel, in which case spearhead 402 may be left unplated. In these embodiments, it may be beneficial to apply a temporary adhesive to spearhead 402 prior to soldering solder ball 418, keeping solder ball 418 in place until soldering is complete.

Interposer 400 may also contain solder mask 404, which may be applied over annular ring 412 up to the edge of via 406. This may prevent flux from solder ball 418 from wicking from solder ball 418 to annular ring 412, and from annular ring 412 to the plated walls of via 406.

In FIG. 4, solder ball 418 may be soldered to one or both of spearhead 402 and annular ring 412. This may occur immediately after stabbing solder ball 418 onto spearhead 408, or it may occur during assembly of interposer 400 to another component, such as a printed wiring board (e.g., a motherboard).

Figure 5:
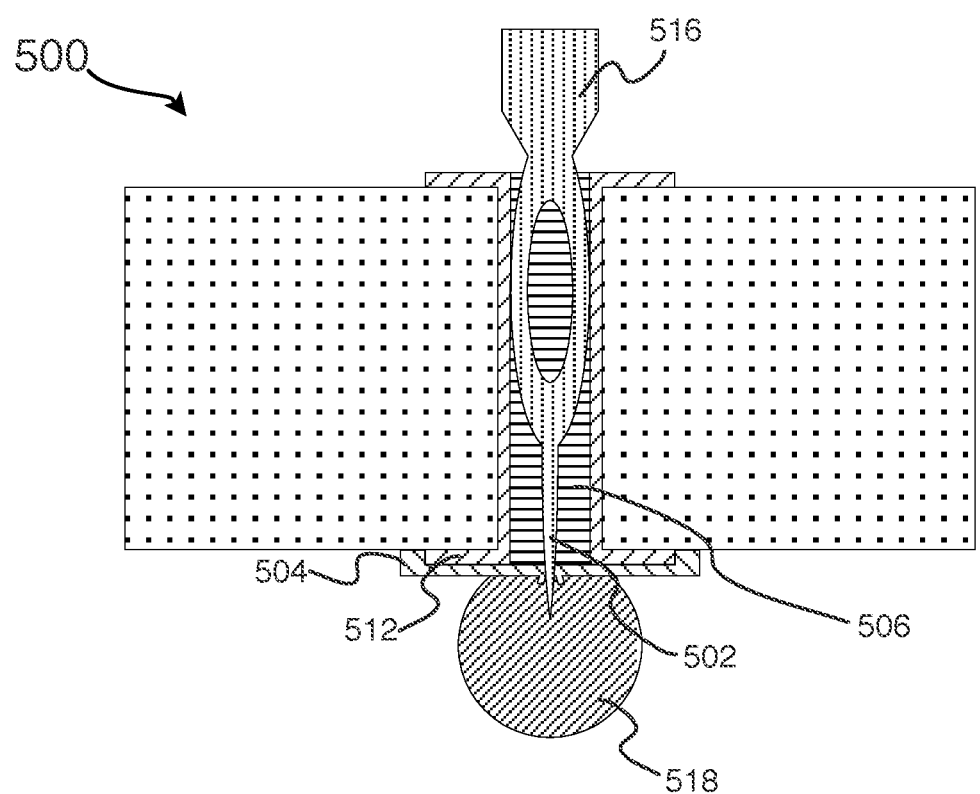
FIG. 5 depicts a cross-section illustration of a hybrid-land-grid-array interposer with a spearhead pin and solder-mask via plug, in accordance with embodiments of the present disclosure.

FIG. 5 depicts a cross-section illustration of a hybrid-land-grid-array interposer 500 with a spearhead pin 502 and solder mask 504. Similarly to the solder mask 404 of FIG. 4, solder mask 504 is applied over annular ring 512. However, unlike solder mask 404, solder mask 504 is applied over the opening of via 506, forming a barrier to prevent flux and solder (for example, from solder 518) from entering via 506. In this embodiment, spearhead 502 of compliant pin 516 has stabbed through solder mask 504. Further, solder ball 518 has been placed upon spearhead 502, giving solder ball 518 a structure to temporarily adhere to prior to reflow. As illustrated, solder ball 518 may form a soldered connection with spearhead 502, creating a structural and electrical connection to the rest of interposer 500.

It is important to note that FIGS. 1A through 5 depict abstract representations of interposers and the components thereof. As such, FIGS. 1A through 5 are not intended to depict exact, precise, or to-scale presentations. Rather, FIGS. 1A through 5 are presented for the ease of understanding the embodiments of this disclosure. For this reason, the sizes and shapes of some components illustrated relative to other components illustrated. For example, annular rings (e.g., annular ring 110) may be smaller in diameter relative to the associated via (e.g., via 106) than presented herein.

Figure 6:
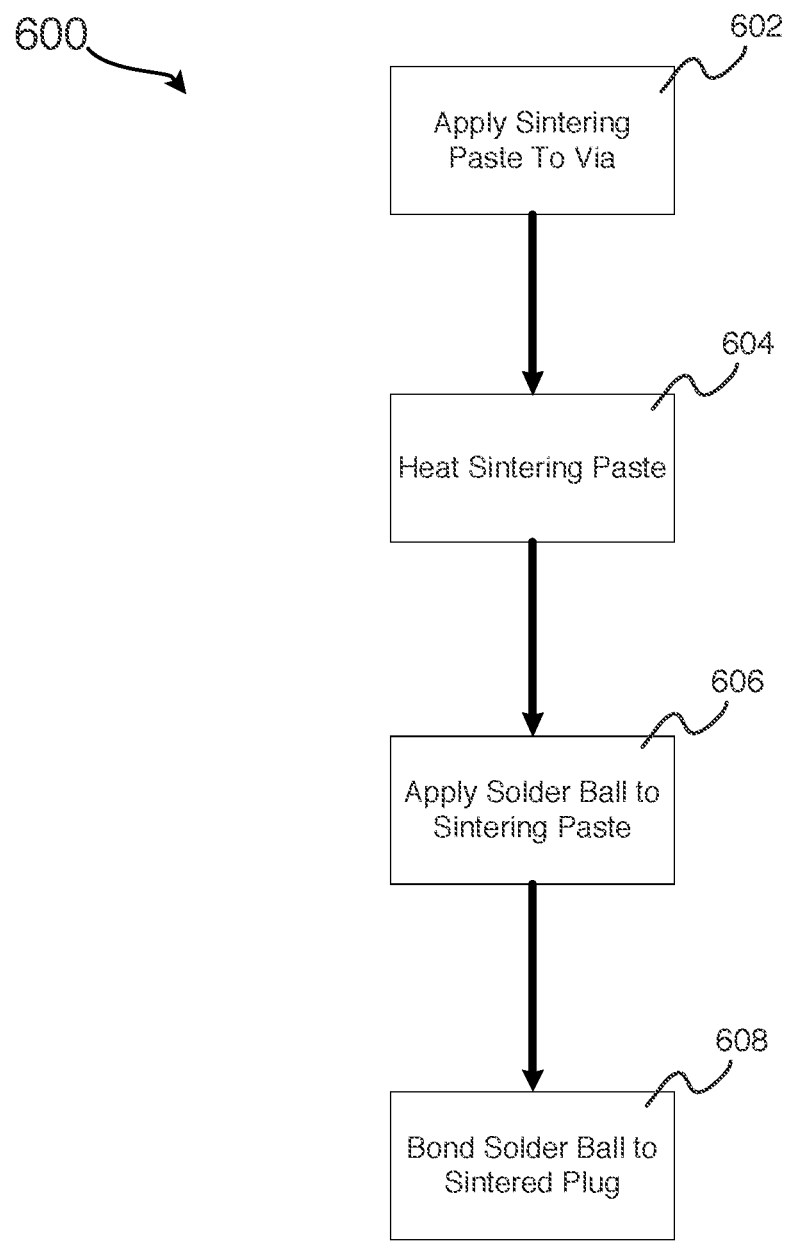
FIG. 6 depicts a method of sintering a via plug, in accordance with embodiments of the present disclosure.

As discussed previously, a via plug may take a solid from or a porous form (e.g., a sintered form). As discussed in connection to FIG. 3, this sintered plug may be applied to a via opening as paste and hardened through a sintering process. FIG. 6 depicts a method 600 of applying and sintering a via plug.

In block 602, a sintered paste (e.g., a porous mixture of tin-bismuth, copper, and flux) is applied to a via opening. After the sintered paste is applied in a manner that blocks flux and solder from entering the via. Then, in block 604, the sintered plug may be heated to solidify the plug and (in some embodiments), create a bond between the solder ball and the interposer (e.g., the interior via plating). Once the via plug is sintered, a solder ball can be added to the plug in block 608, causing the sintered plug to act as a contact pad for the solder ball. In some embodiments, the solder ball may also contact the annular ring of the interposer. In these embodiments, the annular ring may also act as a contact pad for the solder ball and a conduit for a signal to move through the interposer. Finally, block 610 may involve soldering a solder ball to the sintered via plug (e.g., through a reflow process), creating semi-permanent connection structural and electrical connections between the solder ball and the interposer.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method comprising:
applying, to a metal plating of a via on a printed circuit board, a sintering paste;
heating the sintering paste to a temperature at which the paste solidifies, resulting in a sintered via plug;
applying a solder ball to the sintered via plug, wherein applying the solder ball comprises:
applying, using a solder paste, a contact pad to the sintered via plug; and
applying the solder ball to the contact pad; and
heating the solder ball to a temperature at which the solder ball bonds to the sintered via plug.

2. The method of claim 1, herein the sintering paste is a transient liquid phase.

3. The method of claim 1, wherein heating the solder ball comprises performing reflow soldering on the printed circuit board.

4. The method of claim 1, wherein the sintering paste comprises a tin-bismuth mixture.

5. The method of claim 1, wherein a first axis passes through a center of the metal-plated via, a center of the sintered via plug, and a center of the solder ball.

6. A interposer comprising:
a metal-plated via;
a press-fit pin comprising:
a first section that enters a first end the metal-plated via;
a second section that is inside the metal-plated via; and
a third section that exits a second end of the metal-plated via, wherein the third section terminates in a tapered point; and
a solder ball inserted onto the third section and plugging the metal-plated via, wherein the solder ball contacts the second end of the metal-plated via.

7. The interposer of claim 6, wherein the metal-plated via is plated with nickel.

8. The interposer of claim 6, wherein the third section is plated with nickel.

9. The interposer of claim 6, wherein the metal-plated via comprises a first diameter and wherein a first axis spans the center of the metal-plated via, and the interposer further comprises:
a solder mask that is applied to a printed circuit board near the second end of the metal plated via, wherein the solder mask comprises a hole with a second diameter that is equal to the first diameter and wherein the first axis crosses the center of the hole.

10. The interposer of claim 6, further comprising a solder mask that is applied to the printed circuit board near the second end of the metal plated via, wherein the third section of the pin protrudes out of the solder mask.

\* \* \* \* \*